United States Patent [19]

Elderstig

[11] Patent Number: 5,690,841

[45] Date of Patent: Nov. 25, 1997

[54] METHOD OF PRODUCING CAVITY STRUCTURES

[75] Inventor: Håkan Elderstig, Bromma, Sweden

[73] Assignee: Pharmacia Biotech AB, Uppsala, Sweden

[21] Appl. No.: 663,043

[22] PCT Filed: Dec. 8, 1994

[86] PCT No.: PCT/SE94/01181

§ 371 Date: Jun. 10, 1996

§ 102(e) Date: Jun. 10, 1996

[87] PCT Pub. No.: WO95/16192

PCT Pub. Date: Jun. 15, 1995

[30] Foreign Application Priority Data

Dec. 10, 1993 [SE] Sweden .................. 9304145

[51] Int. Cl.⁶ .................. H01L 21/306; G01L 9/00
[52] U.S. Cl. .................. 216/39; 216/51; 216/80; 156/644.1
[58] Field of Search .................. 216/39, 51, 56, 216/80, 97; 156/644.1

[56] References Cited

U.S. PATENT DOCUMENTS

| | | | |
|---|---|---|---|
| 3,880,684 | 4/1975 | Abe .................. | 156/8 |
| 3,887,404 | 6/1975 | Chane .................. | 156/8 |
| 4,885,054 | 12/1989 | Shibagaki .................. | 156/643 |
| 4,908,921 | 3/1990 | Chen et al. .................. | 29/254.1 |
| 4,996,080 | 2/1991 | Guckel et al. .................. | 427/99 |
| 4,996,082 | 2/1991 | Guckel et al. .................. | 427/99 |
| 5,127,990 | 7/1992 | Pribat et al. .................. | 156/644 |
| 5,177,661 | 1/1993 | Zavracky et al. .................. | 361/283 |
| 5,204,690 | 4/1993 | Lorenze, Jr. et al. .................. | 346/1.1 |

FOREIGN PATENT DOCUMENTS

| | | | |
|---|---|---|---|
| 0566929 | 10/1993 | European Pat. Off. .................. | 21/306 |
| 0529479 | 2/1993 | Japan .................. | 21/90 |

OTHER PUBLICATIONS

Tenerz, "Silicon Microcavities Fabricated with a new Technique", Electronic Letters, vol. 22, No. 11, pp. 615–616, May 22, 1986.

Guckel, "A Technology for Integrated Transducers", Internation Conference on Solide State Sensors and Actuators, Transducers '85, pp. 90–92, Jun. 1985.

Proc. 3rd int. Cong. solid–state sensor and actuators, Jun. 1985, (Philadelphia), Petersen, K. et al., "High–Precision, high–performance mass–flow sensor with integrated laminar flow micro–channels", pp. 361–363.

Electronic Letters, vol. 22, No. 11, 22nd May 1986, L. Tenerz et al., "Silicon Microcavities Fabricated with a New Technique", pp. 615–616.

Electronic Letter, vol. 28, No. 17, 13th Aug. 1992, C. Boulas et al., "Lo Loss Multimode Waveguides on Silicon Substrate", pp. 1648–1649.

J. Vac. Sci. Technol. B6(6), Nov./Dec. 1988, Roger T. Howe, "Surface Micromachining for Microsensors and Microactuators", pp. 1809–1813.

Patent Abstracts of Japan, vol. 10, No. 11, E–374, Abstract of JP, A, 60–176239 (Nippon Denki K.K.), 10 Sep. 1985.

Patent Abstracts of Japan, vol. 7, No. 258, E–211, Abstract of JP, A, 58–143535 (Hitachi Seisakusho K.K.), 26 Aug. 1983.

Medicinsk Teknik, vol. 5, 1989; Bertol Hök et al, "Mikromekanik–här har Kisel–fått en ny roll", p. 22.

Primary Examiner—R. Bruce Breneman
Assistant Examiner—Michael E. Adjodha
Attorney, Agent, or Firm—Birch, Stewart, Kolasch & Birch

[57] ABSTRACT

A method of producing sealed cavity structures in the surface layer of a selectively etchable substrate (1), comprises: a) depositing a masking layer (2) of etchable material on the substrate (1), b) by means of etching, opening at least one hole (3) in the masking layer (2) down to the substrate surface, c) through said hole or holes (3) in the masking layer (2) selectively etching the substrate (1) in under the masking layer (2) so as to form one more cavities (4) which extend under the masking layer, and d) sealing said hole or holes (3) in the masking layer (2).

11 Claims, 1 Drawing Sheet

METHOD OF PRODUCING CAVITY STRUCTURES

The present invention relates to a method of producing cavity structures, suitable for use as capillary fluid flow systems, pressure sensors etc., by means of micromechanical manufacturing methods.

One type of micromechanical manufacturing techniques is based upon microelectronic methods known from the semiconductor technology.

It is previously known to manufacture miniaturized analytical systems by means of microelectronic methods. For example, CH-A-679952 discloses the manufacture of an analytical chip, particularly for FIA (Flow Injection Analysis), by making channels in one or both of two plates of glass or silicon by photolithographic means, and then attaching the plates to each other such that a capillary system is defined between the two plates. The thickness of the plates reduces the possibilities of using microelectronic methods for integrating further functions in the system.

U.S. Pat. No. 4,996,082 discloses a method of producing a cavity in a semiconductor substrate, particularly for use as a pressure sensor. In brief, the process consists in depositing onto a semiconductor substrate, typically of crystalline silicon, an oxide layer to a depth equivalent to the height of the desired cavity, depositing a layer of polycrystalline silicon on top of the oxide layer, and then from uncoated side portions of the oxide layer etching out a cavity under the layer of polycrystalline silicon. The etch channel openings can then be sealed by subjecting the substrate to an oxidizing ambient which results in growth of silicon dioxide in the channels sufficient to seal off the channels. Due to the need of etching from a side edge in under the substrate surface, the process is time-consuming and complicated.

FIG. 1 presents the deposition of a masking layer 2 on a substrate 1.

Figure 1:
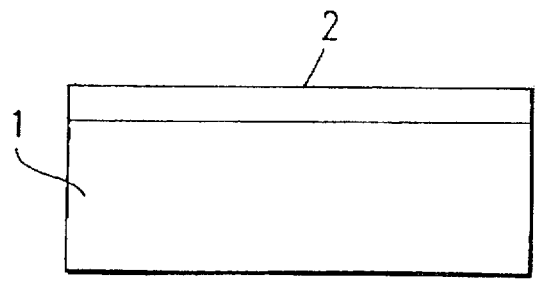

The present invention provides a simplified and improved method of producing cavities of various types under the surface of an etchable substrate.

More particularly, the invention provides a method of producing sealed cavity structures in the surface layer of a selectively etchable substrate by:

a) depositing a protective layer, or masking layer, of etchable material on the substrate, b) by means of etching, opening at least one hole in the masking layer down to the substrate surface, c) through said hole or holes in the masking layer selectively etching the substrate in under the masking layer so as to form one or more cavities which extend under the masking layer, and d) sealing said hole or holes in the masking layer.

The substrate material is preferably glass, quartz or silicon, while the masking layer preferably is polycrystalline silicon (polysilicon) or silicon nitride.

In one embodiment, the masking layer is polysilicon, and the sealing of the opening or openings in the masking layer is effected by oxidation of polysilicon to silicon dioxide, causing expansion of the polysilicon layer. Preferably, the substrate is of quartz, so that the whole finished product after the oxidation is totally of quartz.

In another embodiment, the sealing is effected by deposition of a material layer on the substrate surface and the hole walls. The deposited material may be a metal, a semiconductor or an insulator. The deposition may, for example, take place by sputtering, vaporization or a CVD (Chemical Vapor Deposition) method. If the substrate is of glass or quartz and the deposited material is silicon dioxide (quartz), a product that completely consists of quartz may be obtained.

In a further embodiment, the sealing of the opening or openings is effected by a combination of oxidation of a masking layer of polysilicon and deposition of an additional material layer.

The shape of the holes in the masking layer may vary depending on the desired cavity shape. As examples may be mentioned square and rectangular holes. A continuous cavity can be made in the substrate via etching of a plurality of holes in the masking layer arranged adjacent to each other.

In the following, the invention will be described in more detail with reference to the accompanying drawing, where FIGS. 1 to 5 schematically show different substeps in one embodiment of the method of the invention.

The chemical etching methods to which it will be referred below are well-known per se from inter alia the manufacture of integrated circuits (IC) and will therefore not be described in further detail here. It may, however, be mentioned that two basal etching phenomenons are used in micromachining, i.e. that (i) depending on substrate and etching agent, the etch may be dependent on the crystal direction or not, and (ii) the etch may take place selectively with regard to a specific material.

In a crystal direction dependent etch in a crystalline material, so-called anisotropic etch, etching is effected up to an atomic plane (111), which gives an extremely smooth surface. In a so-called isotropic etch, on the other hand, the etch is independent of the crystal direction.

The above-mentioned selectivity is based upon differences in etch rates between different materials for a particular etching agent. Thus, for the two materials silicon and silicon dioxide, etching with hydrogen fluoride takes place (isotropically) about 1,000 to about 10,000 times faster in silicon dioxide than in silicon. Inversely, potassium hydroxide gives an anisotropic etch of silicon that is about 100 times more efficient than for silicon dioxide, while a mixture of hydrogen fluoride and nitric acid gives a selective isotropic etch of silicon-that is about 10 times faster than in silicon dioxide.

Figure 2:
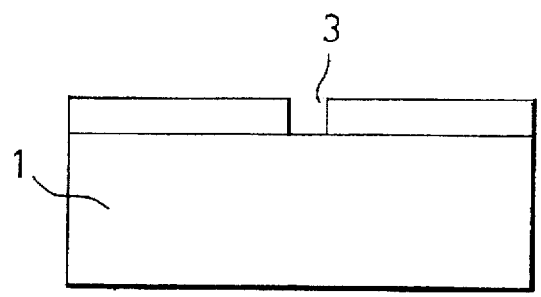
FIG. 2 shows that after application of photoresist and patterning in a conventional manner, a hole 3 is made in the masking layer.

Now turning to the Figures, and with reference first to FIG. 1, one starts from a substrate 1, exemplified here by quartz. Onto the substrate is deposited a masking layer 2, exemplified here by polysilicon, in relation to which the substrate layer is selectively etchable. After application of photoresist and patterning in conventional manner, a hole 3 of a desired configuration is made in the masking layer 2, as is shown in FIG. 2. In the illustrated case, it is assumed that a flow channel (capillary) is to be formed in the substrate, and the hole 3 is therefore oblong, e.g. 1 µm×10 mm (with the longitudinal extension normal to the illustration plane).

Figure 3:
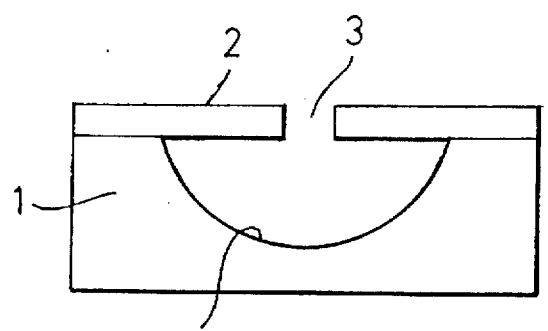
FIG. 3 shows that a selective etch of substrate 1 is carried out through the hole 3.

With reference to FIG. 3, a selective etch of the substrate 1 is then carried out through the hole 3, here by way of example a wet etch with concentrated hydrogen fluoride, whereby the etch extends under the masking layer 2, so-called underetch. The etch is stopped when a cavity (here a flow channel) of the desired depth/width has been obtained.

Figure 4:
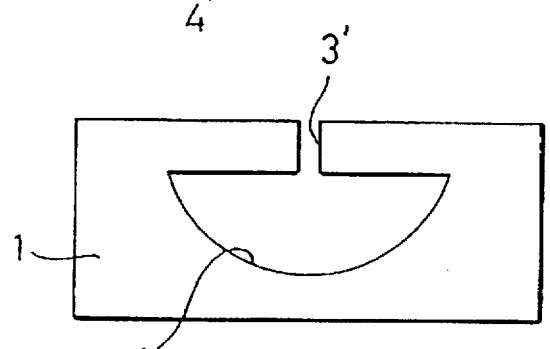
FIG. 4 shows the expansion of the masking layer by the oxidation of the polysilicon to quartz.

The masking layer 2 of polysilicon is then oxidized to quartz, which causes the masking layer, including the walls of the hole 3, to expand, as illustrated in FIG. 4. Depending on the size of the hole 3, this oxidation step may optionally be sufficient for sealing the hole.

In the illustrated case, there still remains, however, as shown in FIG. 4, a small hole 3 in the masking layer 2. Complete sealing of the etched cavity or flow channel 4 is therefore effected, with reference to FIG. 5, by depositing a layer 5 of silicon dioxide (quartz). In the case contemplated here with a quartz substrate, the whole finished structure will therefore consist of quartz.

The substrate 1 in the above example may also be of glass, for example. In that case oxidation of polysilicon to quartz can, however, not be effected, since glass does not withstand the required oxidation temperature. Another alternative material is silicon (e.g. monocrystalline silicon). Furthermore, silicon nitride may be deposited instead of polysilicon as the masking layer 2.

Figure 5:
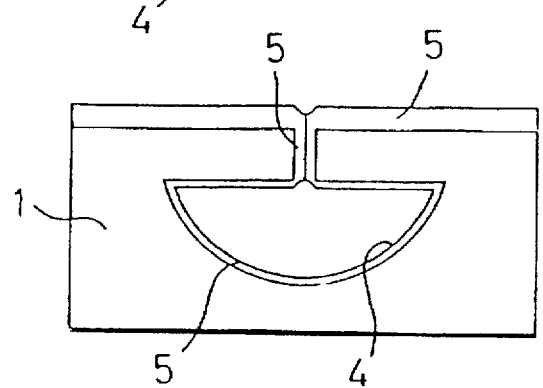
FIG. 5 shows the sealing of the etched cavity or flow channel by depositing a layer 5 of silicon dioxide (quartz).

In FIGS. 3 to 5 the cavity (flow channel) 4 is illustrated as resulting from an isotropic etch. With an anisotropic etch of a silicon crystal, a cavity with a V-shaped profile would have been obtained instead, but without any underetch. Isotropic and anisotropic etching may, however, advantageously be combined in such a way that an isotropic etch of the substrate 1 is first carried out, and the cavity walls are then smoothed in conformity with the crystal orientation by an anisotropic etch, so that the (111)-planes in the silicon crystal are etched out.

It is realized that on the whole just any desired sealed cavity structures can be manufactured by the process just described. The materials are selected with regard to the etch properties as well as the intended use of the finished product. Thus, capillaries may be made as above by opening an oblong hole in the etch mask. Alternatively, instead of an oblong hole, several holes in a row, e.g. square holes, may be made, such that a continuous capillary is formed along the row of holes under the etch mask by underetching the substrate for more than half the hole spacing.

Such capillaries may inter alia be used in chemical analysis systems. They may, for example, form liquid flow systems, e.g. for FIA (Flow Injection Analysis). Alternatively, they may form gas flow systems, e.g. for gas chromatography. A connection cup to a capillary may easily be provided by making a cavity adjacent to the capillary in the substrate. This is accomplished by means of a hole in the masking layer, which hole has a considerably greater lateral extension than the etch depth. In a chemical analysis system, it may sometimes be valuable to produce smooth flow channel walls by an anisotropic etch (optionally preceded by an isotropic etch) as described above, so that the channel walls may function as mirrors for certain applications of optical detection.

It is realized that by means of holes arranged adjacent to each other in the masking layer, it is possible to etch out continuous cavities of practically any shape and extension to suit a desired application.

For example, membranes may be produced according to the method of the invention by making a plurality of holes adjacent to each other, e.g. within a circle of a certain radius, for instance of a radius of about 0.1 mm, and then etching the substrate such that a continuous cavity is etched out under the masking layer. A membrane will then be formed by the free part of the etch mask. Such a membrane may, for example, in combination with a strain gauge or a capacitive transducer be used as a pressure sensor. Another use of such a membrane is as a valve in gas or liquid flow systems. Still another use is for thermal insulation of, for example, a thermistor, e.g. for flow measuring.

Various desired components may easily be integrated in the cavity structures produced according to the invention. For example, electrodes can be integrated in a sealed cavity structure by opening a hole to an already prepared cavity, whereafter the hole is sealed by deposition of a metal layer which is then patterned and etched, so that electrodes are defined on the surface and brought into contact with the cavity. Such a cavity may, for example, be used for conductivity measurements or amperometric measurements. Alternatively, the electrodes are patterned on the substrate over the cavity to be formed before the production thereof, and holes are then made in the etch mask beside the electrodes and an underetch under the electrodes is performed. The holes are then sealed by depositing a thick layer over all of it. Then, the substrate layer under the electrodes is etched from within the cavity through openings thereto, so that the electrodes are brought into contact with the cavity.

When the substrate is a semiconductor material and the etch mask is an insulator, various electronic components, e.g. amplifiers, A/D converters, may in a similar manner be integrated on a substrate with a sealed cavity structure formed according to the method of the invention. For example, the substrate may be silicon while the etch mask may be silicon dioxide or silicon nitride.

Also, optical components may be integrated in the substrate for co-operation with the produced cavity structure. This applies to, for example, the integration of optical waveguides as doped (ion exchange) waveguides in the substrate bulk or as waveguides from glass, silicon nitride or a polymer. In this case the substrate suitably consists of glass.

In the following working example, the production of a flow channel according to the process of manufacture outlined in FIGS. 1 to 5 will be described in more detail.

EXAMPLE

Production of a capillary on a quartz substrate

On a planar substrate of quartz, a 1 µm thick layer of polysilicon is deposited by LPCVD (Low Pressure Chemical Vapor Deposition). After application of photoresist and patterning of a number of holes in a row with a spacing of about 4 µmn (alternatively a single oblong hole of the same length as the hole row), a hole or holes are etched in the polysilicon layer by means of RIE (Reactive Ion Etching). The photoresist is dissolved away, and a selective (isotropic) underetch of the quartz substrate through the holes (alternatively the oblong hole) with concentrated hydrogen fluoride for 5 min gives an about 5 µm deep and about 10 µm wide continuous cavity along the hole row (hole). By thermal oxidation of the polysilicon layer in water vapour, 950° C., for 30 hours, all the silicon is then converted to silicon dioxide. Subsequent deposition of a 1.5 µm TEOS oxide (tetraethylorthosilicate oxide) then plugs the holes (hole) and forms a lid on the substrate. Then, a 0.5 µm layer of LTO (Low Temperature Oxide) with 4% phosphorus is deposited. By heating at 1000° C. the phosphorus glass flows, whereby an almost smooth surface is obtained simultaneously as stresses in the glass disappear.

The invention is, of course, not restricted to the embodiments described above and specifically shown in the drawings, but many modifications and changes may be made within the scope of the following claims.

I claim:

1. A method of producing sealed cavity structures in the surface layer of a selectively etchable substrate, comprising the steps of:

a) depositing a masking layer of etchable polysilicon material on the substrate wherein said substrate is silicon dioxide, b) etching at least one hole in the masking layer down to the substrate surface, c) selectively etching the substrate in under the masking layer through said hole or holes so as to form one or more cavities which extend under the masking layer; and d) sealing said hole or holes in the masking layer by oxidation of polysilicon to silicon dioxide, and thereby expansion of the masking layer.

2. The method according to claim 1, further comprising making a plurality of holes arranged adjacent to each other in the masking layer; and etching a continuous cavity through the holes in the substrate.

3. The method according to claim 2, characterized in that one or more of said holes in the masking layer are oblong.

4. The method of claim 3 further comprising deposition of a silicon dioxide layer on the substrate surface and hole walls.

5. The method according to claim 4, further comprising making a plurality of holes arranged adjacent to each other in the masking layer; and etching a continuous cavity through the holes in the substrate.

6. The method according to claim 4, characterized in that one or more of said holes in the masking layer are oblong.

7. The method according to claim 1, characterized in that one or more of said holes in the masking layer are oblong.

8. The method according to claim 1, characterized in that said cavity or cavities comprise a capillary channel.

9. The method according to claim 1, characterized in that the structure of said cavity is a liquid or gas flow structure for a chemical analysis system.

10. The method according to claim 1, characterized in that the structure of said cavity forms a membrane structure.

11. The method according to claim 1, further comprising integrating electrical, electronic and/or optical components in the sealed cavity structure.

* * * * *